(12) United States Patent
Jin et al.

(10) Patent No.: US 8,513,065 B2
(45) Date of Patent: Aug. 20, 2013

(54) METHOD FOR MANUFACTURING DISPLAY DEVICE

(75) Inventors: Seong-Hyun Jin, Yongin (KR); Jae-Beom Choi, Yongin (KR); Won-Kyu Lee, Yongin (KR); Young-Jin Chang, Yongin (KR); Jae-Hwan Oh, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 229 days.

(21) Appl. No.: 13/178,440

(22) Filed: Jul. 7, 2011

(65) Prior Publication Data

US 2012/0028389 A1    Feb. 2, 2012

(30) Foreign Application Priority Data

Jul. 27, 2010    (KR) .................. 10-2010-0072453

(51) Int. Cl.
*H01L 21/00* (2006.01)
*H01L 21/76* (2006.01)
*H01L 21/20* (2006.01)
*G01J 5/62* (2006.01)
*G06K 9/00* (2006.01)

(52) U.S. Cl.
USPC ........... 438/151; 438/401; 438/487; 438/795; 250/491.1; 382/151

(58) Field of Classification Search
USPC ........ 438/29, 151, 401, 487, 795; 250/491.1; 257/E21.002, E21.134, E21.094, E21.413; 382/151

See application file for complete search history.

(56) References Cited

U.S. PATENT DOCUMENTS

| | | | |
|---|---|---|---|
| 2004/0135226 A1* | 7/2004 | Yoshimura et al. | 257/499 |
| 2006/0027809 A1* | 2/2006 | Ogawa et al. | 257/66 |
| 2006/0125120 A1* | 6/2006 | Kim | 257/797 |
| 2007/0236690 A1* | 10/2007 | Kimba et al. | 356/237.4 |
| 2008/0102320 A1* | 5/2008 | Edelstein et al. | 428/828 |
| 2008/0138957 A1* | 6/2008 | Yang | 438/401 |
| 2008/0157082 A1* | 7/2008 | Yang et al. | 257/59 |

FOREIGN PATENT DOCUMENTS

| | | |
|---|---|---|
| JP | 2010-004012 A | 1/2010 |
| KR | 10-2007-0070383 A | 7/2007 |
| KR | 10-2007-0109589 A | 11/2007 |

* cited by examiner

*Primary Examiner* — Charles Garber
*Assistant Examiner* — Ron Pompey
(74) *Attorney, Agent, or Firm* — Knobbe, Martens, Olson & Bear LLP

(57) ABSTRACT

A method of manufacturing a display device is disclosed. In one embodiment, the method includes: i) forming a semiconductor layer where a plurality of crystallized areas and a plurality of noncrystallized areas are alternately arranged on a substrate, ii) aligning the substrate based on a difference in contrast ratio between the crystallized and noncrystallized areas and iii) performing a photo process or a photolithography process.

10 Claims, 5 Drawing Sheets

METHOD FOR MANUFACTURING DISPLAY DEVICE

RELATED APPLICATIONS

This application claims priority to and the benefit of Korean Patent Application No. 10-2010-0072453 filed in the Korean Intellectual Property Office on Jul. 27, 2010, the entire contents of which are incorporated herein by reference.

BACKGROUND

1. Field

The described technology generally relates to a method for manufacturing a display device, and more particularly, to a method for manufacturing a display device capable of effectively and precisely aligning a substrate during a manufacturing process.

2. Description of the Related Technology

Most of flat panel displays such as an organic light emitting diode display and a liquid crystal display are manufactured through various thin film processes. If the thin film processes are not performed while the substrate is precisely aligned, a pattern is not accurately formed, causing a defect.

Therefore, an align key for aligning the substrate should be additionally formed. Further, when the align key is formed in advance, an error which is generated during the process cannot be reflected.

The above information disclosed in this Background section is only for enhancement of understanding of the background of the described technology and therefore it may contain information that does not form the prior art that is already known in this country to a person of ordinary skill in the art.

SUMMARY

One inventive aspect is a method for manufacturing a display device having advantages of effectively and precisely aligning a substrate during a manufacturing process.

Another aspect is a method for manufacturing a display device that includes: forming a semiconductor layer where a plurality of crystallized areas and a plurality of noncrystallized areas are alternately arranged on a substrate; aligning the substrate by using a difference in contrast ratio between the plurality of crystallized areas and the plurality of noncrystallized areas; and performing a photo process or a photolithography process.

The plurality of crystallized areas and the plurality of noncrystallized areas of the semiconductor layer may be arranged in a line pattern parallel to each other.

The forming of the semiconductor layer may include forming an amorphous silicon layer and crystallizing a part of the amorphous silicon layer by selectively irradiating laser to the amorphous silicon layer.

The amorphous silicon layer may be selectively crystallized by turning on/off the oscillation of the laser.

An oscillation on/off cycle of the laser may be in proportion to the widths of the crystallized area and the noncrystallized area.

The substrate may be divided into a plurality of pixel areas, and one or more thin film transistors and a capacitor may be formed for each of the plurality of pixel areas.

Each of the plurality of pixel areas may include one or more crystallized areas and one or more noncrystallized areas.

In the method for manufacturing a display device, the aligning of the substrate may include acquiring the contrast ratio between the crystallized area and the noncrystallized area and recognizing one or more crystallized areas among the plurality of crystallized areas as an align key on the basis of the difference in the contrast ratio.

The align key may become both edges of the crystallized area.

In the method for manufacturing a display device, the aligning of the substrate may include acquiring the contrast ratio between the crystallized area and the noncrystallized area and recognizing a boundary line between the crystallized area and the noncrystallized area as an alignment line on the basis of the difference in the contrast ratio.

DETAILED DESCRIPTION

Figure 1:
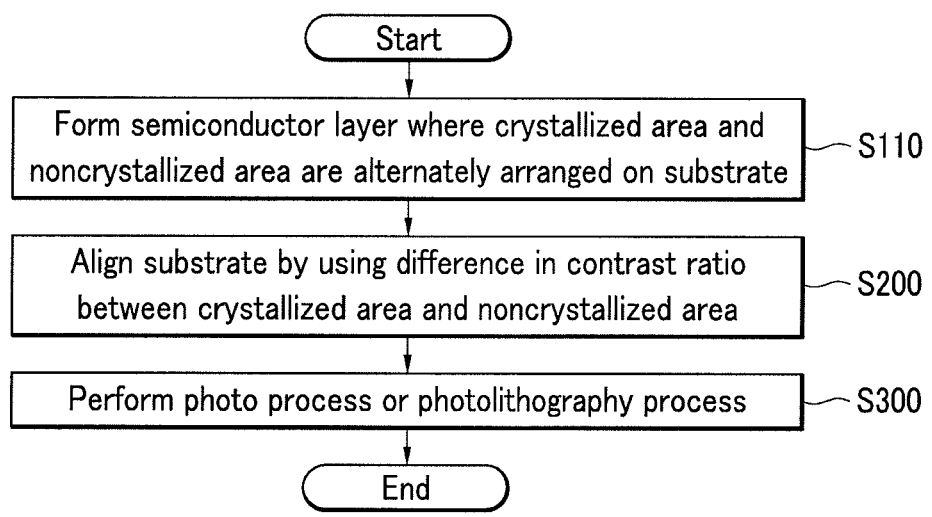
FIG. 1 is a flowchart illustrating a method for manufacturing a display device according to a first embodiment.

Embodiments will be described more fully hereinafter with reference to the accompanying drawings. As those skilled in the art would realize, the described embodiments may be modified in various different ways.

Further, like reference numerals designate like elements throughout the specification. In addition, in describing a second embodiment, components different from the first embodiment will be mainly described.

In addition, the size and thickness of each component shown in the drawings are arbitrarily shown for understanding and ease of description, and are not considered limiting.

In the drawings, for understanding and ease of description, the thicknesses of some layers and areas may be exaggerated. It will be understood that when an element such as a layer, film, region, or substrate is referred to as being "on" another element, it can be directly on the other element or intervening elements may also be present.

Hereinafter, referring to FIGS. 1 to 3, the method for manufacturing a display device according to the first embodiment will be described.

As shown in FIG. 1, first, a semiconductor layer 130 is formed on a substrate 111 (S110). As shown in FIG. 2, the semiconductor layer 130 includes a plurality of crystallized areas CA and noncrystallized areas NCA which are alternately arranged. Herein, the crystallized areas CA and the noncrystallized areas NCA are arranged in a line pattern substantially parallel to each other.

Forming the semiconductor layer 130 specifically includes forming an amorphous silicon layer on the substrate 111 and crystallizing a part of the amorphous silicon layer by selectively irradiating laser to the amorphous silicon layer.

The method of selectively irradiating the laser includes a method of controlling the oscillation of the laser. For example, as shown in FIG. 3, when the amorphous silicon layer is scanned while turning on and off the oscillation of the laser, the semiconductor layer 130 where the crystallized areas CA and the noncrystallized areas NCA are alternately arranged is formed. In this case, a scan direction of the laser crosses length directions of the crystallized area CA and noncrystallized area NCA which are formed in the line pattern. That is, the scan direction of the laser is substantially the same as width directions of the crystallized area CA and the noncrystallized area NCA.

The on/off cycle L of the laser oscillation is substantially in proportion to the widths of the crystallized area CA and the noncrystallized area NCA. For example, a period B in which the laser oscillation is turned on is substantially in proportion to the width of the crystallized area CA and a period C in which the laser oscillation is turned off is substantially in proportion to the width of the noncrystallized area NCA. That is, when the scan velocity of the laser is the same, the widths of the crystallized area CA and the noncrystallized area NCA increase as the on/off period cycle of the laser oscillation increases.

Figure 2:
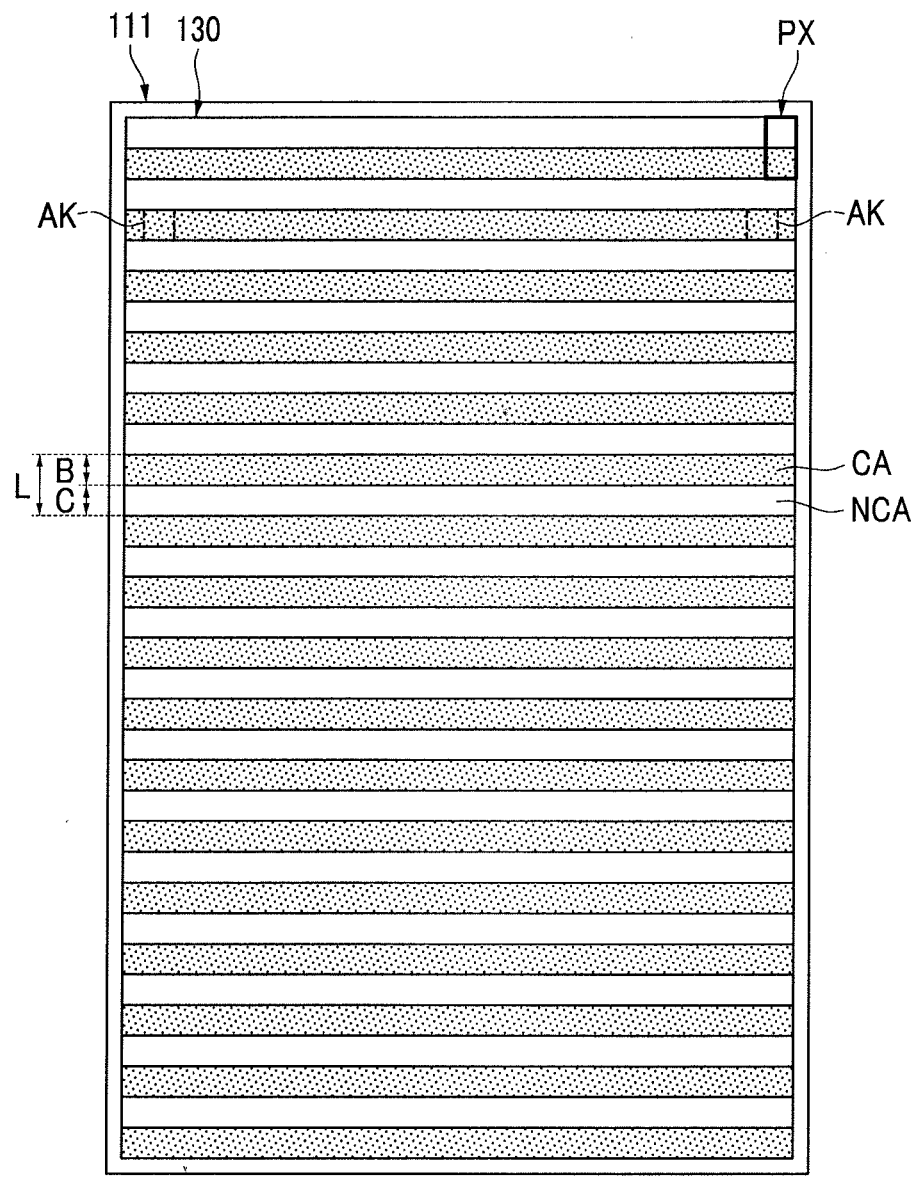
FIG. 2 is a substrate on which a semiconductor layer is formed, which is used in the method for manufacturing a display device according to the first embodiment.
Figure 3:
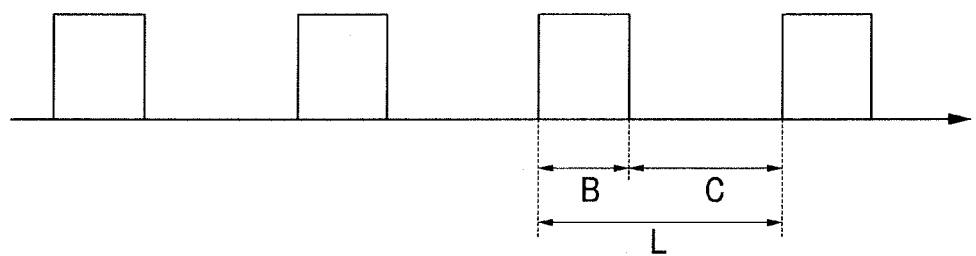
FIG. 3 is a graph illustrating an oscillation cycle of a laser used in the method for manufacturing a display device according to the first embodiment.

Meanwhile, the substrate 111 is divided into a plurality of pixel areas PX as shown in FIG. 2 and each of the pixel areas PX includes one or more crystallized area CA and noncrystallized area NCA.

Further the method of selectively irradiating the laser is not limited to the method of turning on/off the oscillation of the laser as described above. For example, the laser may be intermittently irradiated by using a galvanometer or a polygon mirror without controlling the oscillation of the laser.

As such, when the semiconductor layer 130 is not crystallized throughout an overall surface thereof but is crystallized by selectively irradiating the laser to an area where thin film transistors 10 and 20 (shown in FIG. 4) will be formed, it is possible to improve productivity. That is, it is possible to crystallize more substrates 111 with laser of the same energy amount.

Next, the substrate 111 is aligned by using a difference in contrast ratio between the crystallized areas CA and the noncrystallized areas NCA (S200).

In one embodiment, aligning the substrate 111 includes acquiring the contrast ratio between the crystallized area CA and the noncrystallized area NCA and recognizing one or more crystallized area CA among the crystallized areas CA as an align key AK on the basis of the difference in the contrast ratio. That is, the substrate 111 is aligned on the basis of the crystallized area CA recognized as the align key AK. In this case, the align key AK may be both edges of the crystallized area CA of the line pattern.

As such, when the crystallized area CA crystallized by the laser is utilized as the align key AK, an additional align key may not be formed and the substrate 111 may be aligned by reflecting an error which is generated while crystallizing the crystallized area by using the laser.

When the crystallized area CA and the noncrystallized area NCA of the line pattern are alternately formed by using the laser, an error is generated in the crystallized area CA and the noncrystallized area NCA in comparison with the first alignment state due to an error caused by beam tilt of the laser. It is possible to prevent a defect from being generated in a follow-up process by controlling the error to be about 0.0005 degrees or less. For example, since the process is performed by dividing one pixel area PX into the crystallized area CA and the noncrystallized area NCA, more precise alignment is desirable.

However, when the substrate is aligned after crystallization by using the align key formed before the crystallization process using the laser, it is difficult to control the error to be about 0.0005 degrees or less.

However, since the method for manufacturing a display device according to the first embodiment utilizes the crystallized of the line pattern which is crystallized by using the laser as the align key, it is possible to remove the error by the beam tilt of the laser beam.

By such an alignment method, it is possible to align the substrate in the width direction more precisely than the length direction of the crystallized area CA. However, there is a spare of an error margin in the length direction of the crystallized area CA which is formed in the line pattern. Therefore, although a slight error is generated while the substrate 111 is firstly aligned in the length direction of the crystallized area CA, it is not a problem. In contrast, according to the first embodiment, it is possible to precisely align the substrate in the length direction of the crystallization area CA.

Next, while the substrate 111 is aligned, the semiconductor layer 130 is patterned by a photolithography process or one or ore layer is formed on the semiconductor layer 130 and is patterned by using the photolithography process to thereby manufacture the display device (S300). Further, a photo process for other processes may be performed.

Figure 4:
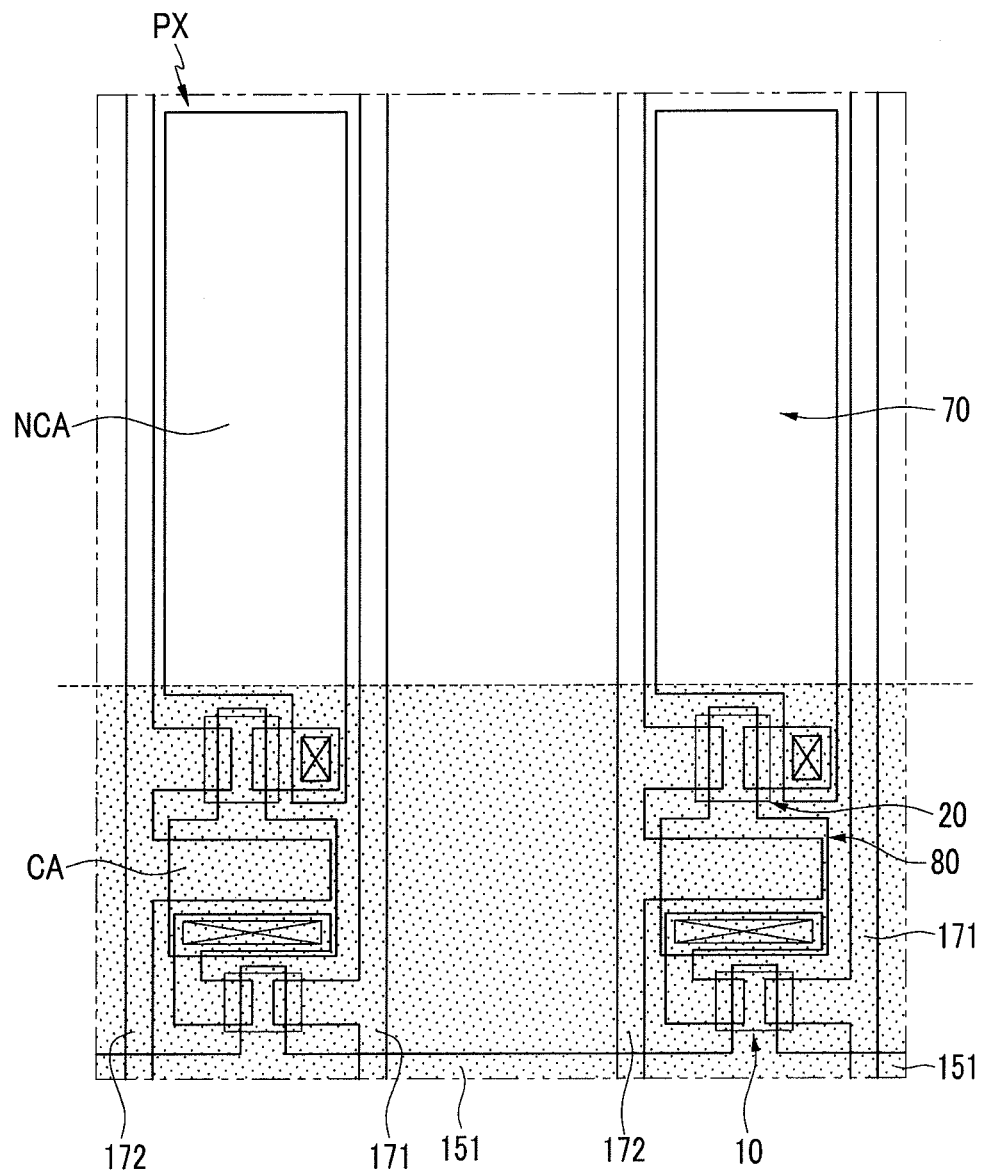
FIG. 4 is a layout view of a display device manufactured by the method for manufacturing a display device according to the first embodiment.

As shown in FIG. 4, one pixel area PX may be generally defined by a gate line 151, a data line 171, and a common power supply line 172. However, the first embodiment is not limited thereto. For example, one pixel area PX may be defined regardless of the gate line 151, the data line 171, and the common power supply line 172.

Further, one or more thin film transistors 10 and 20, a capacitor 80, and an organic light emitting diode 70 are formed for each one pixel area PX. The thin film transistors 10 and 20 are formed in the crystallized area CA. The capacitor 80 may be formed in the crystallized area CA and in the noncrystallized area NCA or may be formed in both areas CA and NCA. The organic light emitting diode 70 is formed in the noncrystallized area NCA. Further, in accordance with the type of the display device, a pixel electrode for driving liquid crystals may be formed instead of the organic light emitting diode 70.

As described above, according to the manufacturing method according to the first embodiment, it is possible to simply align the substrate 111 and precisely align the substrate 111 by minimizing the error.

Hereinafter, referring to FIG. 5, a method for a display device according to a second embodiment will be described.

Figure 5:
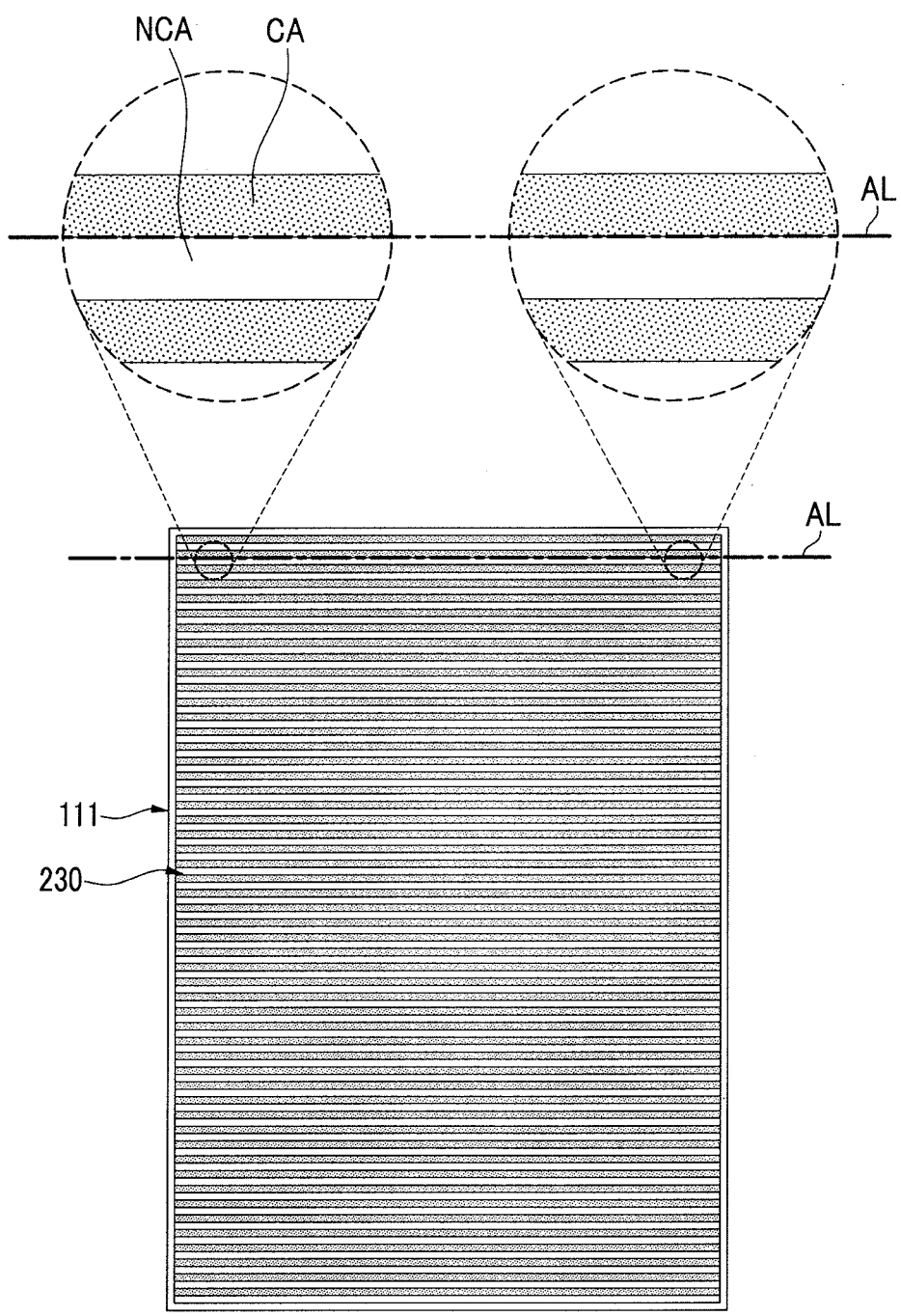
FIG. 5 is a substrate on which a semiconductor layer is formed, which is used in a method for manufacturing a display device according to a second embodiment.

As shown in FIG. 5, in the method for manufacturing a display device according to the second embodiment, the widths of a crystallized area CA and a noncrystallized area NCA of a semiconductor layer 230 which is formed on a substrate 111 are densely formed. That is, since the width of the crystallized area CA is too small, the crystallized area is not suitable to be used as an align key.

Therefore, in the second embodiment, a contrast ratio between the crystallized area CA and the noncrystallized area NCA is acquired and a boundary line between the crystallized area CA and the noncrystallized area NCA is recognized as an alignment line AL on the basis of a contrast ratio difference. That is, the substrate 111 is aligned on the basis of the boundary line between the crystallized area CA and the noncrystallized area NCA, which is recognized as the alignment line AL.

As such, when the boundary line AL between the crystallized area CA and the noncrystallized area NCA is utilized as the alignment line AL, even in the case in which it is difficult to utilize the crystallized area CA itself as the alignment key due to too small width of the crystallized area CA, it is possible to effectively align the substrate 111.

Further, an additional align key may not be formed and the substrate can, of course, be aligned by reflecting an error generated during the crystallization by using laser.

According to at least one of the disclosed embodiments, a method for manufacturing a display device can effectively and precisely align a substrate during the manufacturing process.

The disclosed embodiments are not considered limiting and intended to cover various modifications and equivalent arrangements included within the spirit and scope of the appended claims.

What is claimed is:

1. A method for manufacturing a display device, comprising:
    forming a semiconductor layer where a plurality of crystallized areas and a plurality of noncrystallized areas are alternately arranged on an entire surface of a substrate;
    aligning the substrate based on a difference in contrast ratio between the crystallized and noncrystallized areas without separately forming an align key; and
    performing a photo process or a photolithography process after the aligning.

2. The method of claim 1, wherein the crystallized and noncrystallized areas of the semiconductor layer are arranged in a line pattern substantially parallel to each other.

3. The method of claim 2, wherein the forming comprises:
    forming an amorphous silicon layer; and
    selectively irradiating laser light onto the amorphous silicon layer so as to crystallize a part of the amorphous silicon layer.

4. The method of claim 3, wherein the laser light is oscillated so as to selectively crystallize the amorphous silicon layer.

5. The method of claim 4, wherein the oscillation cycle of the laser is substantially in proportion to the widths of the crystallized and noncrystallized areas.

6. The method of claim 2, wherein the substrate is divided into a plurality of pixel areas, and wherein one or more thin film transistors and a capacitor are formed for each of the pixel areas.

7. The method of claim 6, wherein: each of the pixel areas comprises one or more crystallized areas and one or more noncrystallized areas.

8. The method of claim 1, wherein the aligning comprises:
    acquiring the contrast ratio between the crystallized and noncrystallized areas; and
    recognizing one or more crystallized areas among the crystallized areas as an align key on the basis of the contrast ratio.

9. The method of claim 8, wherein the align key is both edges of the crystallized area.

10. The method of claim 1, wherein the aligning comprises:
    acquiring the contrast ratio between the crystallized and noncrystallized areas; and
    recognizing a boundary line between the crystallized and noncrystallized areas as an alignment line.

* * * * *